United States Patent [19]

Splinter et al.

[11] 4,303,455

[45] Dec. 1, 1981

[54] LOW TEMPERATURE MICROWAVE ANNEALING OF SEMICONDUCTOR DEVICES

[75] Inventors: Michael R. Splinter, Silverado; Richard F. Palys; Moiz M. Beguwala, both of Placentia, all of Calif.

[73] Assignee: Rockwell International Corporation, El Segundo, Calif.

[21] Appl. No.: 130,509

[22] Filed: Mar. 14, 1980

[51] Int. Cl.³ .................... H01L 21/263; H05B 9/03
[52] U.S. Cl. ........................ 148/1.5; 148/187; 219/121 L; 357/91; 427/45.1; 427/53.1
[58] Field of Search ............... 148/1.5, 187; 427/53.1, 427/45.1; 219/121 L, 10.55 R, 10.57; 357/91

[56] References Cited

U.S. PATENT DOCUMENTS

| | | | |
|---|---|---|---|
| 3,777,099 | 12/1973 | Levinson | 219/10.55 |
| 4,147,911 | 4/1979 | Nishitani | 219/10.55 M |
| 4,181,538 | 1/1980 | Narayan et al. | 148/1.5 |
| 4,221,948 | 9/1980 | Jean | 219/10.55 A |
| 4,240,843 | 12/1980 | Celler et al. | 148/1.5 |

OTHER PUBLICATIONS

Celler et al. Appl. Phys. Letts. 32(8), 1978, p. 464.
Danileiko et al. Sov. Phys. Semicond. 12 (1978) 1152 (English).
Bomke et al. Appl. Phys. Letts. 33 (1978) 955.

*Primary Examiner*—Upendra Roy
*Attorney, Agent, or Firm*—H. Fredrick Hamann; Daniel R. McGlynn

[57] ABSTRACT

Briefly, and in general terms, the present invention provides a process for fabricating a semiconductor device, the device includes a semiconductor substrate having a major surface including an ion implanting region, wherein one fabrication step in the process subsequent to the formation of the ion implantation region is to direct a beam of microwave radiation at the device for annealing the ion implanted regions.

5 Claims, 3 Drawing Figures

LOW TEMPERATURE MICROWAVE ANNEALING OF SEMICONDUCTOR DEVICES

The invention relates to the annealing of semiconductor devices, and in particular the healing of radiation damage to semiconductor crystals that occurs during implantation of impurities.

It has been established that short pulses of laser or electron beam radiation can be used to heal radiation damage to semiconductor crystals that occurs during the implantation of impurities. In many of these prior art experiments it was found that the boundary of the impurity region moves substantially during the annealing process.

Another technique to promote localized annealing is to place the wafer in a high temperature (800°-1100° C.) furnace. Such high temperature processing however causes degradation in the overall yield and performance of the semiconductor devices. Prior to the present invention there has not been a suitable low temperature annealing technique for healing the radiation damage to semiconductor crystals.

Briefly, and in general terms, the present invention provides a process for fabricating a semiconductor device, the device comprising a semiconductor substrate having a major surface including an ion implanting region, wherein one fabrication step in the process subsequent to the formation of the ion implantation region is to direct a beam of microwave radiation at the device for annealing the ion implanted regions.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

Figure 1:
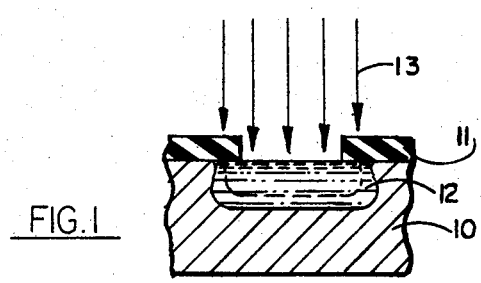
FIG. 1 is a highly simplified diagrammatic view of the low temperature annealing process according to the present invention.

Turning now to FIG. 1 there is shown a highly simplified diagramatic view of the process according to the present invention. A substrate material 10, which in a preferred embodiment is a semiconductor such as silicon or gallium arsenide, or other substrates susceptible to advantageous ion implant processes, is provided. The substrate is covered, but for the window shown, by a masking layer 11, such as silicon dioxide. An electromagnetic wave having a frequency in the microwave portion of the spectrum is indicated by the schematic beam 13 and is incident on the window. Reference numeral 12 indicates the position of the impurity boundary after ion implanting of the region under the window and before annealing. Upon exposure to the microwave frequency beam, the semiconductor region anneals. In accordance with one aspect of the invention, the annealing process can be adopted and controlled either to minimize redistribution or to achieve a controlled movement of implanted impurities.

The present invention is based upon the fact that the energy of electromagnetic radiation can be coupled to a crystalline lattice, or even to a damaged crystalline lattice. The coupling of such energy to an ionized impurity in the lattice increases the local temperature of the lattice, so that the impurity atom and the surrounding lattice structure seeks the lowest free energy configuration which would still be an ordered crystal structure. The increase in the local temperature of the lattice could be due to the coupling of the electromagnetic radiation with a local oscillator formed by the molecular configuration including the impurity. Lattice heating is also associated with the release of phonons. The method according to the present invention couples the energy from the microwave radiation to the implanted dopant species and the damaged semiconductor crystal. The energy would typically be dissipated as phonons in the lattice, causing mechanical vibration and heat to be generated. As the ionized impurities become substitutional in the lattice, eddy currents in the doped regions will also be induced resulting in increased heating which may aid in the annealing.

It is presently known (e.g., from T. P. Ma, W. H. Ma, Int'l. Electron Device Meeting, Washington, D. C., Dec. 1-3, 1977), that RF plasmas will promote annealing of charged surface states and broken bonds at a $SiO_2$—Si interface. The present invention goes beyond such prior art in the use of higher frequencies as well as the specific application of annealing ion implanted surfaces. In fact, only the damaged and heavily doped areas will be affected by the technique according to the present invention since the remaining undamaged silicon will be essentially transparent to the electromagnetic waves at frequencies in the gigaHertz range. This special feature apparently results in annealing only the desired regions.

One application of the present invention is to promote localized annealing in integrated circuits at a low temperature. Presently, annealing is primarily done in a high temperature (800°-1100°) furnace. High temperature steps cause degradation in overall yield and performance. The search for a low temperature annealing technique has been underway since the discovery of laser annealing, see, for example B. A. Kachurin, N. B. Pridachin and L. S. Smirnov, Sov. Phys.—Semicond. 9, 946 (1975).

The local mode oscillation frequency is approximately 16 gHz. This frequency is higher than the frequency of microwaves ($\approx$1–10 gHz) generated in a commercial high power (>1 watt) microwave source. The absorption spectrum of the local defect size created by the ion implanted specie has a broad frequency range. It is expected that one can couple the lower frequency radiation with sufficient power to cause annealing.

Figure 2:
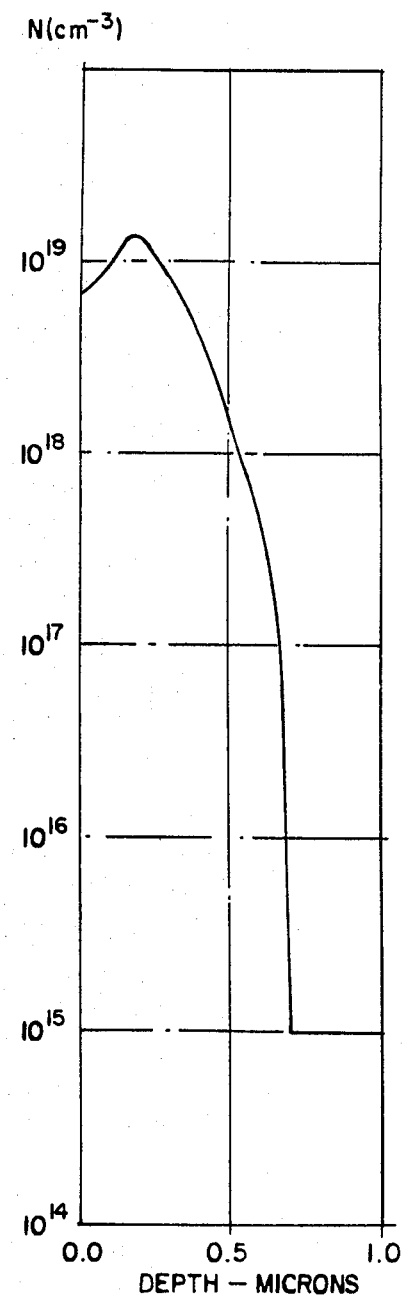
FIG. 2 is a plot showing the final impurity distribution profile in an ion implanted region in a semiconductor device which has been annealed according to the prior art.

FIG. 2 is the concentration profile obtained on one half of a test wafer that was thermally annealed according to techniques known in the prior art. The anneal conditions were 1000° C., 30 mins in $N_2$. The figure indicates that although complete electrical activation of the implanted specie has been obtained, the impurity has redistributed within the sample to increase the junction depth from approximately 0.5 $\mu m$ in the 'as-implanted' wafers to 0.8 $\mu m$ in the thermally annealed samples. These results must be contrasted with the microwave annealed samples in which there is no appreciable impurity redistribution, as described below.

Figure 3:
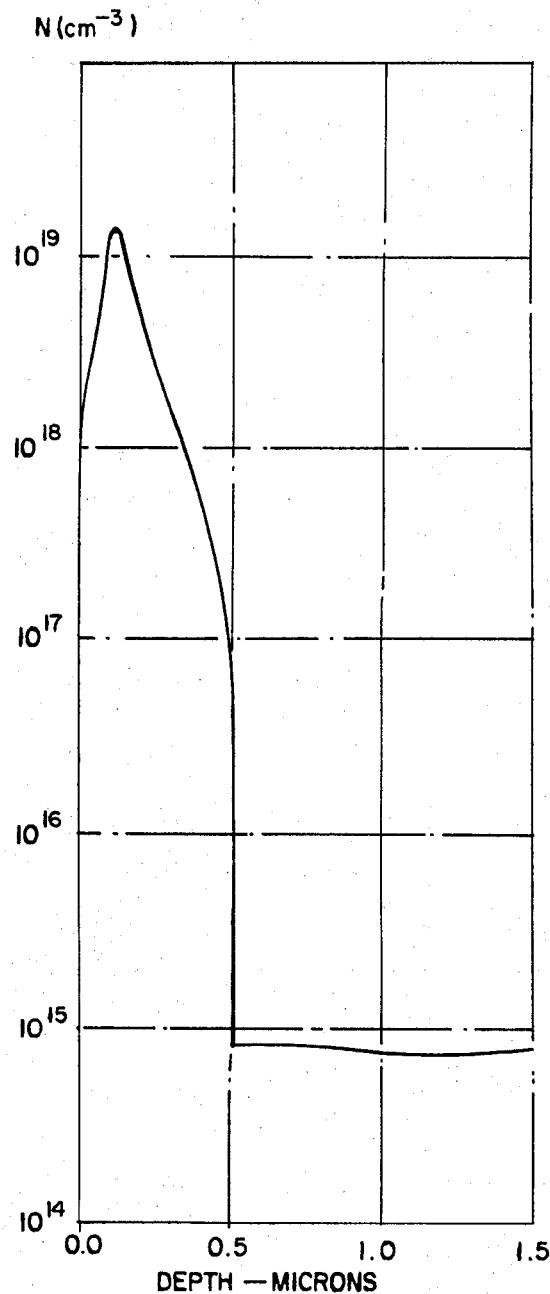
FIG. 3 is a plot of the distribution profile in an ion implanted region in a semiconductor device which has been annealed by microwave radiation according to the present invention.

FIG. 3 is the concentration profile on one half of a test wafer obtained after the same test wafer was annealed for 30 mins. in a commercial microwave oven according to the present invention. The wafer was placed in the microwave oven, a beam of microwave radiation was directed at the wafer. The ambient was a partial vacuum which was obtained by enclosing the sample in a quartz capsule. The implant specie was phosphorus with a concentration of $5 \times 10^{14}/cm^2$ implanted at 100 Kev. The substrate material was p-type silicon. The profile in FIG. 3 was obtained from a spreading resistance measurement performed on a beveled surface. It can be seen from this figure that only partial activation was achieved in this duration of 30 mins and that there was no appreciable impurity distribution.

It will be obvious to those skilled in the art that the semiconductor device according to the present invention can be manufactured with various semiconductor technologies and different combinations of known process steps, and that the preferred embodiments illustrated here are merely exemplary. The depth of penetration of the various zones and regions and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than silicon, for example $A_{III}-B_V$ compounds, may be used. Furthermore, the conductivity types in the embodiment may be interchanged and corresponding to such change, the polarity of the respective operating voltages adapted. Moreover, the voltage level and the static or dynamic nature of the signals applied to the various terminals and gates of the device, as well as the voltage sources, may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A process for fabricating a semiconductor device, the device comprising a semiconductor substrate having a major surface including an ion implanted region, characterized in that one fabrication step in the process subsequent to the formation of the ion implanted regions is to direct a beam of microwave radiation at said entire device for annealing the ion implanted regions.

2. A process as defined in claim 1, wherein said one fabrication step anneals charged surface states so as to cause substitution of the impurity atoms in the silicon lattice.

3. A process as defined in claim 1, wherein said one fabrication step takes place at room temperature, and said beam of microwave radiation produces only localized heating of said device.

4. A process as defined in claim 1, wherein said microwave radiation is of a frequency in the range of 1 to 10 gigaHertz so that the electromagnetic field of the microwave radiation couples with the semiconductor lattice of the ion-implanted region causing lattice heating due to the release of phonons, the remaining non-ion-implanted silicon being essentially transparent to the radiation.

5. A process as defined in claim 1, wherein the step of directing a beam of microwave radiation comprises placing said device in a microwave oven.

* * * * *